(12) United States Patent
Zagorianakos et al.

(10) Patent No.: US 6,717,834 B2
(45) Date of Patent: Apr. 6, 2004

(54) DUAL BUS MEMORY CONTROLLER

(75) Inventors: Steven W. Zagorianakos, Brookline, NH (US); Donald McManus, Bedford, NH (US)

(73) Assignee: Intel Corporation, Santa Clara, CA (US)

(*) Notice: Subject to any disclaimer, the term of this patent is extended or adjusted under 35 U.S.C. 154(b) by 58 days.

(21) Appl. No.: 10/108,243

(22) Filed: Mar. 26, 2002

(65) Prior Publication Data

US 2003/0185032 A1 Oct. 2, 2003

(51) Int. Cl.$^7$ ................................................. G11C 5/06
(52) U.S. Cl. ............... 365/63; 365/230.01; 365/230.03; 365/198; 710/240; 710/107
(58) Field of Search ............................. 365/63, 230.01, 365/230.03, 198; 710/240, 107, 305

(56) References Cited

U.S. PATENT DOCUMENTS

| | | | |
|---|---|---|---|
| 4,967,398 A | * 10/1990 | Jamoua et al. | ......... 365/230.05 |
| 5,721,860 A | 2/1998 | Stolt et al. | |
| 6,078,983 A | * 6/2000 | Hanawa et al. | ............. 710/240 |
| 6,178,518 B1 | 1/2001 | Toda | |
| 6,240,495 B1 | 5/2001 | Usui | |
| 6,272,609 B1 | 8/2001 | Jeddeloh | |
| 6,282,583 B1 | * 8/2001 | Pincus et al. | ............... 709/400 |
| 6,330,645 B1 | * 12/2001 | Harriman | .................... 711/151 |
| 6,487,621 B1 | * 11/2002 | MacLaren | ................... 710/240 |
| 2002/0073259 A1 | * 6/2002 | Grisenthwaite | ............. 710/107 |

* cited by examiner

*Primary Examiner*—Van Thu Nguyen
*Assistant Examiner*—Toan Le
(74) *Attorney, Agent, or Firm*—Fish & Richardson P.C.

(57) ABSTRACT

A memory controller initiates a first memory access in response to receipt of a first memory access request. The memory controller receives a second memory access request and initiates a second memory access in response to receipt of the second memory request prior to completing the first memory access.

30 Claims, 3 Drawing Sheets

DUAL BUS MEMORY CONTROLLER

BACKGROUND

This invention relates to a dual bus memory controller.

A computer system with multiple processors relies on memory to store data and instructions processed and executed by the processors. The processors access the memory by generating memory access requests which are converted by a memory controller into memory access commands that are compatible with the memory. The rate at which the memory controller can process memory access requests may be slower than the rate at which the memory can process the commands. Consequently, the memory controller can adversely affect the rate at which data is exchanged between the memory and the processors.

DETAILED DESCRIPTION

Figure 1:
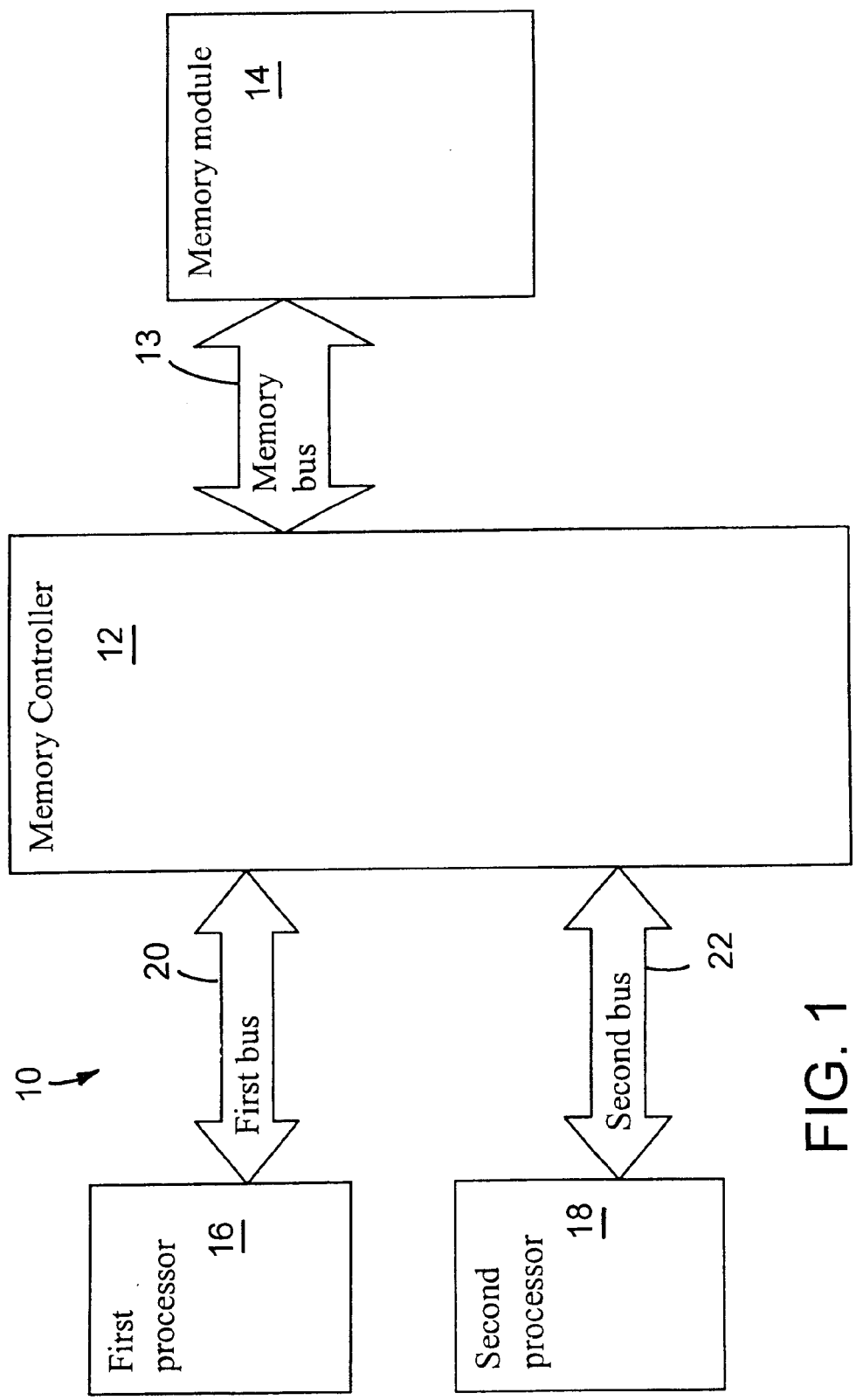
FIG. 1 is a block diagram of a computer system.

Referring to FIG. 1, a computer system 10 includes a memory controller 12 for processing requests to access a memory module 14. First and second processors 16, 18 generate the memory access requests over first and second buses 20, 22, which are coupled to the memory controller 12. The memory controller 12 translates the requests into memory access commands that are sent to the memory module 14 over a memory bus 13.

Each memory access request can include a request to access a portion of the memory module 14 such as one or more memory locations. For example, the first processor 16 may issue a first memory access request to write data to a portion of the memory module 14 and/or to read data from another portion of the memory module. At substantially the same time that the first memory access request is issued, the second processor 18 may issue a similar memory access request to access the same or another portion of the memory module 14. The memory controller 12 handles these multiple memory access requests in a pipeline fashion. As explained in greater detail below, the memory controller 12 can initiate a first memory access based on the first memory access request and then initiate a second memory access based on the second memory access request before completing the first memory access.

Figure 2:
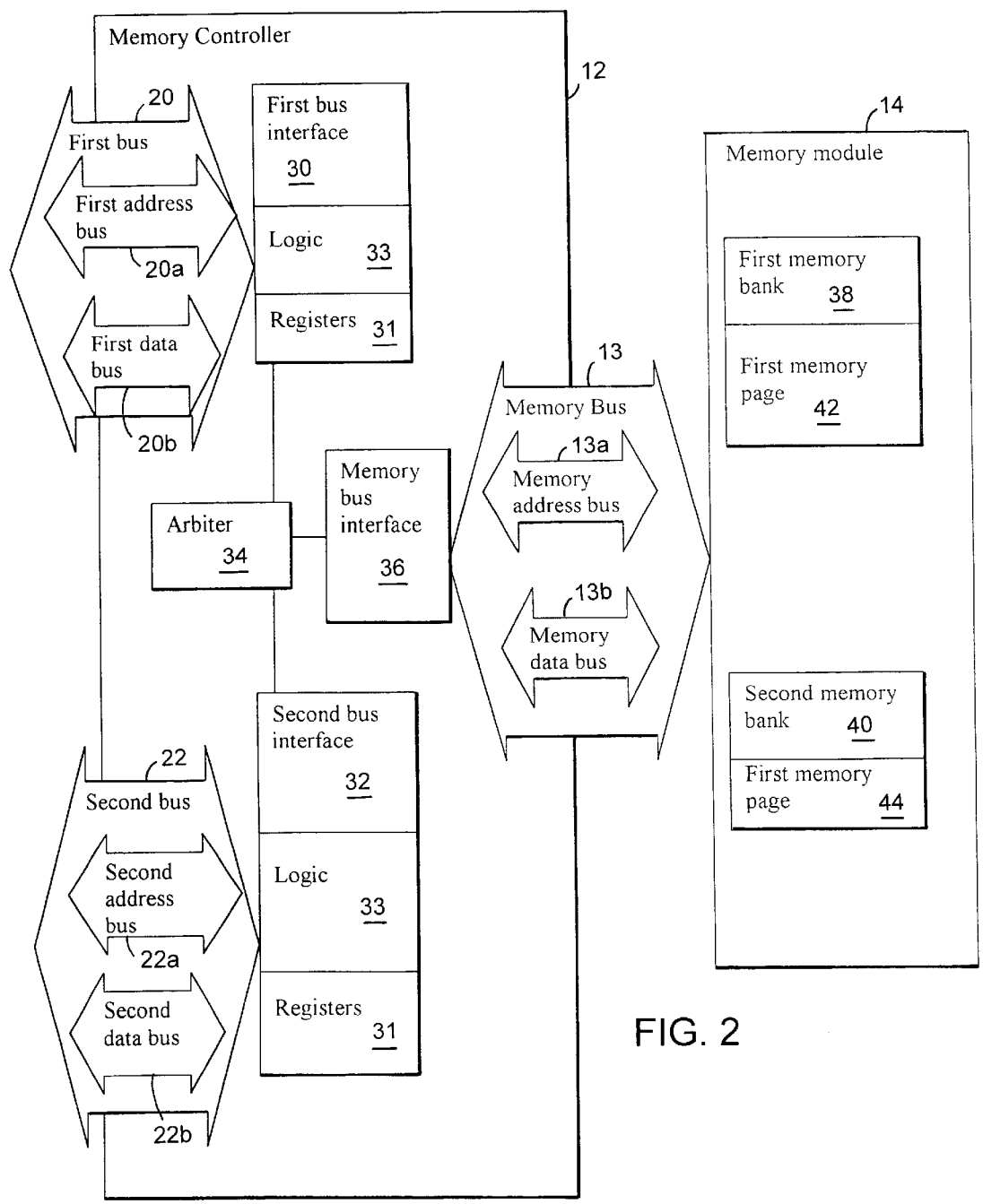
FIG. 2 is a block diagram of a memory controller.

Referring to FIG. 2, the memory controller 12 includes a first bus interface 30 that provides an interface for memory access requests sent by the first processor 16 over the first bus 20. Likewise, a second bus interface 32 provides an interface for memory access requests sent by the second processor 18 over the second bus 22.

The first and second buses 20, 22 can be implemented as a single processor bus, a multiple processor bus such as an advanced micro-controller bus architecture (AMBA) bus, or other bus structure. The memory access requests are sent over the first and second buses 20, 22 and can include an address specifying the location of the data to be accessed from the memory module 14. The requests also include commands indicating whether the memory access request pertains to a read operation or a write operation.

For example, in one embodiment, the first bus 20 includes a first address bus 20a and a first data bus 20b. The first address bus 20a carries an address A1 representing the address of the data requested in the first memory access request. The first data bus 20b carries data D1 representing the data retrieved from the memory location specified by address A1. Similarly, the second bus 22 includes a second address bus 22a and a second data bus 22b. The second address bus 22a carries an address A2 representing the address of the data requested in the second memory access request. The address A2 corresponds to a memory location in the memory module. The second data bus 22b carries data D2 retrieved from the memory location specified by the second address A2. Alternatively, if the memory access request seeks to write data to the memory module, the data D1, D2 can represent data to be written to the respective address locations represented by the addresses A1, A2.

The first and second bus interfaces 30, 32 convert the memory access requests into an internal format allowing the memory controller 12 to process the memory requests in a consistent manner. The first and second bus interfaces 30, 32 can include registers 31 to store the memory access requests and logic 33 to process the memory access requests.

The first and second bus interfaces 30, 32 forward the converted memory access requests to an arbiter 34. Because there are two processors 16, 18 competing for access to the memory module 14 over the single memory bus 13, the arbiter 34 determines the order in which to process the memory access requests.

The arbiter 34 can employ various predetermined criteria to make this determination. For example, when the memory controller 12 is in an idle state and receives simultaneous memory access requests from the first and second processors 16, 18, the arbiter 34 can be programmed to service the memory access request from the first processor 16 first and then service the memory access request from the second processor 18. Otherwise, if the memory controller 12 does not receive simultaneous memory access requests, the memory access requests can be serviced according to a priority scheme such as a first-come-first-served scheme.

The arbiter 34 is coupled to the memory bus 13 through a memory bus interface 36. One function of the memory bus interface 36 is to convert the memory access requests received from the arbiter 34 into memory access commands that are compatible with the particular memory module 14.

An example of a memory module 14 includes an array of memory cells connected to each other by row and column lines. Each memory cell stores a single bit and is accessed by a memory address that indexes a row of the memory array and a column address that indexes a column of the array. Accordingly, each memory address points to the memory cell at the intersection of the row specified by the row address and the column specified by the column address.

To access the memory cells in the memory module 14, the memory controller 12 translates the memory access requests from the first and second processors 16, 18 into memory access commands that are sent over the memory bus 13. To perform these functions, the memory bus 13 includes a memory address bus 13a and a memory data bus 13b. The memory address bus 13a carries row and column addresses A1, A2 from the first and second address buses 20a, 22a. The memory data bus 13b carries data exchanged between the memory module 14 and the first and second data buses 20b, 22b. In response to the memory access commands, data is transferred between the processors 16, 18 and the memory module 14 through the memory controller 12.

In one embodiment, the memory module 14 includes synchronous dynamic random access memory (SDRAM).

SDRAM can reduce the memory access time compared to dynamic access random access memory (DRAM). Memory access time can be defined as the duration from the time when a memory access request is issued by a processor to the time when the data is transferred between the processor and the memory. The memory controller 12 for synchronous memory, such as SDRAM, receives a system clock signal and operates in a synchronous manner with the first and second processors 16, 18 so that data is exchanged with the processors at predefined edges of the clock signal.

In SDRAM memory, the memory cells can be organized into regions of memory such as memory banks. For example, the memory module 14 can be organized into a first memory bank 38 and a second memory bank 40. Although SDRAM often includes eight memory banks, only two memory banks are shown to simplify the description. Each of the memory banks 38, 40 can be further divided into memory pages, each of which is defined as a row of memory within a memory bank.

For example, each of the memory banks 38, 40 can be divided into one or more memory pages 42, 44. Each memory page 42, 44 represents a row of memory cells. Once a memory page is activated by a memory access, it is kept open such that any column within that row can be accessed multiple times without having to reactivate the memory page. However, only one memory page should be kept open for each memory bank before another memory page in the memory bank can be accessed. Therefore, if the memory access request seeks access to a new memory page that is not currently open, then the currently opened memory page should be closed before the new memory page can be accessed. Once a memory access causes a memory page to be opened in a memory bank, the memory page can remain open in the memory bank without having to close and then reopen the memory page if a subsequent memory access is made to the same memory page.

By using memory banks 38, 40 with memory pages 42, 44, the memory controller 12 can access data from the memory module 14 in an interleaved fashion. That is, both memory banks 38, 40 can be activated simultaneously to provide an increase in data transfer speed between the memory processors 16, 18 and the memory module 14. For example, the first processor 16 can be programmed to issue memory access requests directed to the first memory bank 38, and the second processor 18 can be programmed to issue memory access requests directed to the second memory bank 40.

Programming each processor to issue consecutive memory access requests directed to the same memory page within a memory bank can increase the data transfer speed further. For example, the first processor 16 can be programmed to issue memory access requests directed to the first memory page 42 of the first memory bank 38. In a similar manner, the second processor 18 can be programmed to issue memory access requests directed to the first memory page 44 of the second memory bank 40.

Figure 3:
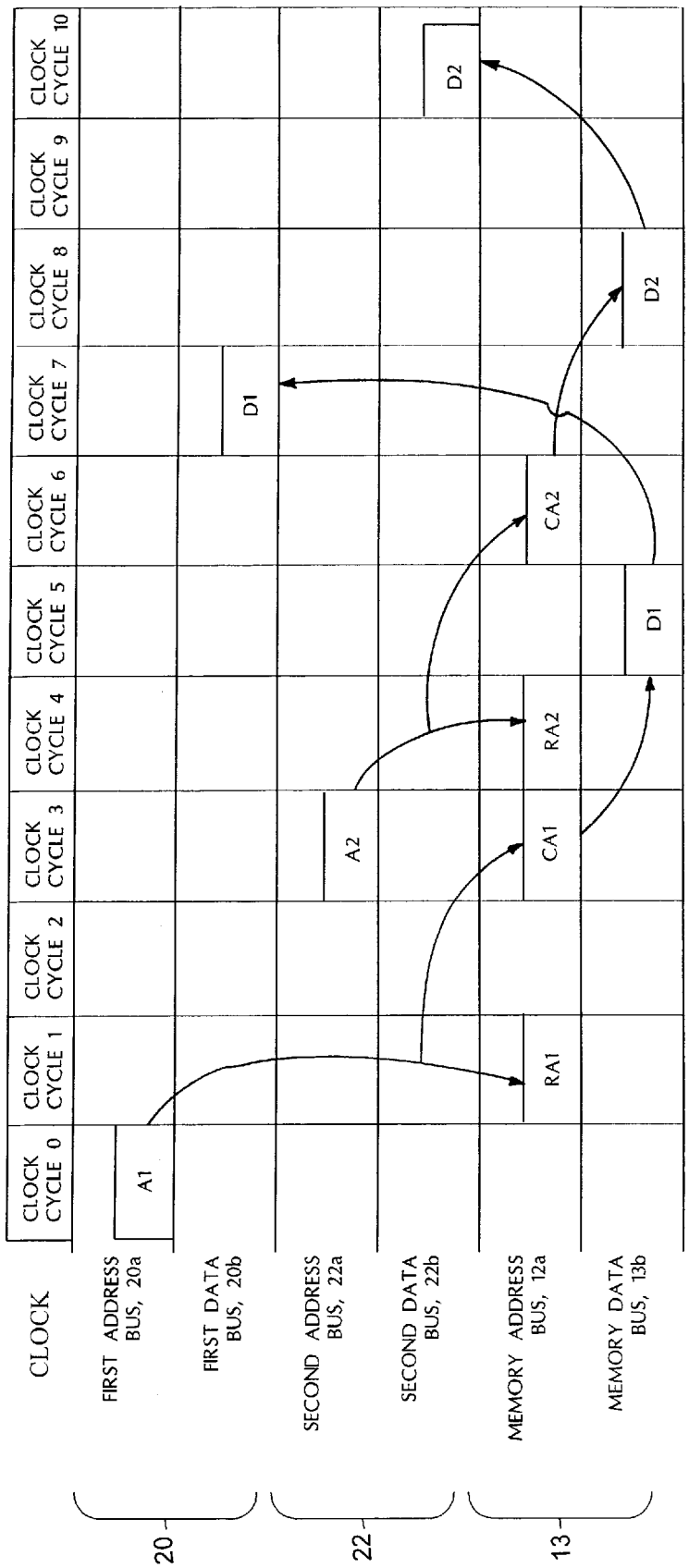
FIG. 3 is a timing diagram depicting a memory access operation.

Referring to FIG. 3, the diagram shows the timing of a memory read access operation according to one implementation. In this example, it is assumed that the memory controller 12 receives a first memory access request over the first bus 20 from the first processor 16 to read data D1 at a memory location A1 in the memory module 14. The memory controller 12 initiates a first memory access at clock cycle 0 and completes the first memory access at clock cycle 7. During this memory access time, the memory controller 12 retrieves the data D1 stored in the memory location specified by address A1 from the memory module 14. The memory controller 12 places the data D1 on the first data bus 20b for the first processor 16 to retrieve.

It is further assumed that the memory controller 12 receives a second memory access request over the second bus 22 from the second processor 18 to read data D2 from memory location A2 in the memory module 14. The memory controller 12 initiates the second memory access at clock cycle 3 and completes the second memory access at clock cycle 10. During this memory access time, the memory controller 12 retrieves the data D2 from memory location A2 from the memory module 14 and places it on the second data bus 22b for the second processor 18 to retrieve. Thus, the memory controller 12 is able to initiate a second memory access before completing the first memory access.

Further details of the memory access requests in FIG. 3 are now explained. At clock cycle 0, the memory controller 12 receives over the first bus 20 the first memory access request from the first processor 16 to read the data D1 located at the memory location A1. The address bus 20a carries the address A1 representing the address of the data D1 requested in the first memory access request. The address A1 corresponds to a memory location in the memory module 14 such as the first memory page 42 of the first memory bank 38.

The first bus interface 30 translates the first memory access request into an internal format compatible with the memory controller 12. The arbiter 34 receives the reformatted first memory access request and decides whether to initiate a first memory access. That decision is based on whether the arbiter 34 has received a simultaneous memory access request from the second processor 18. As described above, the arbiter 34 is programmed to decide the order in which to process simultaneous memory access requests. This decision can be based on predetermined criteria such as the priority assigned to each processor.

In this case, it is assumed that the first processor 16 has been assigned a higher priority than the second processor 18. Therefore, if the arbiter receives simultaneous memory access requests, it first initiates the memory access corresponding to the first processor 16 and then initiates the memory access corresponding to the second processor 18. In this example, the arbiter 34 determines that the first memory request is the only memory request it has received and so forwards the formatted first memory request to the memory bus interface 36.

The first request seeks to access a portion of memory in the memory module such as a memory page of a memory bank. The memory bus interface 36 evaluates the first request to determine whether it should perform a memory page operation on the memory module before it can initiate the first memory access.

If the first request seeks to access a memory page of a memory bank that is closed, the memory bus interface 36 issues a command to close the current memory page and issues another command to open the memory page requested by the first request. In that case, additional clock cycles may be required to handle the close and open commands. However, a subsequent memory access request to the same memory bank and memory page would not require an additional clock cycle.

If the first memory access request specifies a memory page of a memory bank that is currently open, the memory bus interface 36 converts the first memory access request into a format compatible with the memory module 14. In this case, since no additional page commands are necessary, no additional clock cycles are required.

At clock cycle 1, the memory bus interface 36 initiates the memory access by sending the converted memory request to the memory module 14 over the memory address bus 13a that carries a row address RA1 corresponding to the row address portion of the address A1. A row address is not required if a page is already opened (Actually, this is a SDRAM restriction).

The memory controller 12 can use clock cycle 2 for internal overhead processing.

At clock cycle 3, the memory controller 12 places on the memory address bus 13a a column address CA1 corresponding to the column address portion of the address A1.

In this example, during clock cycle 3, the memory controller 12 receives the second memory access request over the second bus 22 from the second processor 18. The second address bus 22a carries the address A2 representing the address of the data requested in the second memory access request. The address A2 corresponds to a memory location in the memory module 14 such as the first memory page 44 of the second memory bank 40.

The second bus interface 32 translates the format of the second memory access request into an internal format compatible with the other components of the memory controller 12.

Like the first memory access request, the second memory access request specifies the type of request such as a data read or write operation and an address of the data. The address of the data corresponds to a region of the memory module 14 such as the first memory page 44 of the second memory bank 40. The arbiter 34 receives the reformatted second memory access request and decides whether to initiate a second memory access based on whether it has received a simultaneous memory request from the first processor 16.

In this example, because the arbiter 34 has not received a simultaneous memory access request from the first processor 16, the arbiter forwards the formatted second memory access request to the memory bus interface 36. In addition, the first access is still outstanding. The memory bus interface 36 evaluates the second memory access request to determine whether it needs to perform additional memory page operations on the memory module 14 before it can initiate a second memory access.

If the second memory access request seeks access to a memory page and a memory bank different from the memory page and memory bank requested in the first memory request, then the memory bus interface 36 can initiate the second memory access. In this example, it is assumed that the first memory access request seeks to access a first memory page 42 of the first memory bank 38, whereas the second memory request seeks to access a first memory page 44 in the second memory bank 40. Thus, there is no memory access conflict between the two memory requests and the second memory access can be initiated without generating additional clock cycles for page commands.

It also is assumed in this example that the first memory page 44 of the second memory bank 40 requested by second memory access request is open. Thus the memory bus interface 36 does not have to issue a page close and open command. The memory bus interface 36 initiates a second memory access by converting the second memory request into a format that is compatible with memory bus 13. Thus, the memory controller 12 is able to initiate a second memory access before completing the first memory access.

At clock cycle 4, the memory controller 12 converts a row address portion of the address information specified in the second memory request into the corresponding row address RA2 which is placed on the memory address bus 13a.

At clock cycle 5, the memory module 14 retrieves the data D1 and places it on the memory data bus 13b. The data D1 represents the data in the memory specified by the row address RA1 and the column address CA1.

At clock cycle 6, the memory controller 12 accepts the data D1 from the memory data bus 13b and places the column address CA2 on the memory address bus 13a. The column address CA2 corresponds to the column address portion of the address A2 in the second request.

At clock cycle 7, the memory controller 12 places the data D1 onto the first data bus 20a. As a result, at clock cycle 7, the first processor 16 can receive the data D1 at a memory location represented by the address A1 specified in the first memory access request. During this clock cycle, the memory module 14 fetches the data D2 requested by the second memory request. In this example, the subsequent clock cycles are associated with the second memory access request because the first memory request has been completed. However, in general, the memory controller 12 is capable of receiving and processing a subsequent memory request from the first processor 16.

At clock cycle 8, the memory module 14 retrieves the data D2 located at a memory location represented by the row address RA2 and column address CA2 specified in the second memory request. The memory module 14 places the data D2 on the memory data bus 13b so that the memory controller 12 can accept it.

At clock cycle 9, the memory controller 12 accepts the data D2 from the memory data bus 13b. At clock cycle 10, the memory controller 12 places the data D2 onto the second data bus 22b so that the second processor 18 can retrieve the data requested in the second memory access request.

At this point, the memory controller 12 is capable of processing subsequent memory access requests from the first processor 16 and the second processor 18. As the timing diagram (FIG. 3) illustrates, the memory controller 12 can initiate a second memory access before the first memory access is completed. For example, the first memory access was initiated at clock cycle 1 and the second memory access was initiated at clock cycle 4 before the completion of the first memory access at clock cycle 7. In the illustrated example, the first processor 16 issues the first memory access request at clock cycle 0 and waits until at least clock cycle 8 before it can issue a subsequent memory access request.

Although the above diagram was described in the context of memory read access operations, the technique also can be applied to memory write access operations. For example, the first and second processors 16, 18 can issue various combinations of memory read and write access requests which can be processed by the memory controller 12 in an interleaved fashion. The memory controller 12 can handle a memory read request from the first processor 16 while at the same time handling a memory write request from the second processor 18 or vice-versa.

In one embodiment, the memory controller 12 can be part of a network processor. The network processor can be a specialized processor optimized to process different data types from multiple sources. Examples of such data types include local area network (LAN), wide area network (WAN) and voice data. The network processor can include one or more packet processors each configured to handle a specific data type. Each of the packet processors can be coupled to the first bus 20 implemented as a multiple processor bus such as an AMBA bus. The network processor also can include one or more routing processors coupled to the second bus 22. The first and second buses 20, 22 also can be coupled to each other using a bridge to communicate messages between the first and second buses. The memory controller 12 can be coupled between the first and second buses 20, 22 and the memory module 14.

In operation, each packet processor receives respective data over respective data lines and determines whether to accept the data. If the data is accepted, the packet processor transfers the data to the memory module using the memory controller 12. Once the data has been transferred, the packet processor sends a message to the routing processor indicating where the received data is located. The routing processor retrieves the data from the memory controller 12, determines where the data should be routed and communicates this information to the appropriate packet processor. In response to this routing information, the appropriate packet processor retrieves the data, packages the data so that it can reach its proper destination and transmits the data over the appropriate data lines.

Using the techniques, the overall data transfer rate of a computer system having multiple processors can be increased. In an embodiment using SDRAM, the memory controller can take advantage of the memory bank and memory page structure to increase further the overall transfer rate. Moreover, the transfer rate can be improved further by configuring each processor to issue memory access requests to access data in separate memory banks within the same memory page so as to minimize closing and opening of pages in the memory module 14.

Various features of the invention can be implemented in hardware, software, or a combination of hardware and software. For example, some aspects of the system can be implemented in an application-specific integrated circuit (ASIC), field-programmable gate array (FPGA) or other hardware. In another example, some aspects of the system can be implemented in computer programs executing on programmable computers. Each program can be implemented in a high level procedural or object-oriented programming language to communicate with a computer system. Furthermore, each such computer program can be stored on a storage medium, such as read-only-memory (ROM) readable by a general or special purpose programmable computer or processor, for configuring and operating the computer when the storage medium is read by the computer to perform the functions described above.

Other implementations are within the scope of the following claims.

What is claimed is:

1. A method comprising:
   initiating a first memory access in response to receipt of a first memory access request;
   receiving a second memory access request; and
   initiating a second memory access in response to the second memory request prior to completing the first memory access,
   wherein the second memory access is initiated without deferring the first memory access or without deferring the second memory access.

2. The method of claim 1 further comprising converting the first and second memory requests into a format compatible with a memory.

3. The method of claim 1 further comprising generating page commands to a memory.

4. The method of claim 1 further comprising deciding which memory access to initiate first according to predetermined criteria if the first and the second memory access requests are received simultaneously.

5. The method of claim 1 further comprising converting addresses specified in the first and second memory access requests into respective row and column addresses.

6. The method of claim 1 further comprising retrieving first and second data from first and second locations specified, respectively, by the first and second memory access requests.

7. An apparatus comprising:
   first and second bus interfaces to receive respective first and second requests to access memory; and
   an arbiter coupled to the first and second bus interfaces to initiate a first memory access in response to receipt of the first memory access request and to initiate a second memory access in response to the second memory request prior to completing the first memory access,
   wherein the second memory access is initiated without deferring the first memory access or without deferring the second memory access.

8. The apparatus of claim 7 further comprising a memory bus interface coupled to the arbiter to convert addresses specified in the first and second access requests into respective row and column addresses.

9. The apparatus of claim 7 further comprising a memory bus interface coupled to the arbiter to retrieve first and second data from respective first and second locations specified, respectively, by the respective first and second memory access requests.

10. The apparatus of claim 7 further comprising:
    a memory; and
    a memory bus interface coupled to the arbiter to convert the first and second memory access requests into a format compatible with the memory.

11. The apparatus of claim 7 further comprising:
    a memory; and
    a memory bus interface coupled to the arbiter to determine whether to generate page commands to the memory.

12. The apparatus of claim 7 wherein the arbiter is configured to decide which memory access request to initiate first according to predetermined criteria, if the first and the second memory access requests are received simultaneously.

13. The memory controller of claim 7 wherein the first and second bus interfaces are configured to convert memory access requests into a common format.

14. A system comprising:
    first and second buses and a memory bus;
    a first processor to generate a first memory access request over the first bus;
    a second processor to generate a second memory access request over the second bus;
    a memory to exchange data over the memory bus; and
    a memory controller coupled to the memory through the memory bus, the memory controller comprising:
       a first bus interface coupled to the first bus to receive the first memory access request to access the memory,
       a second bus interface coupled to the second bus to receive the second memory access request to access the memory, and
       an arbiter coupled to the first and second bus interfaces to initiate a second memory access in response to the second memory request prior to completing a first memory access in response to the first memory request, wherein the second memory access is initiated without deferring the first memory access or without deferring the second memory access.

15. The system of claim 14 wherein each of the first and second memory access requests are directed to access a first memory bank of the memory.

16. The system of claim 14 wherein the memory includes synchronous dynamic random access memory.

17. The system of claim 14 wherein the memory controller further comprises a memory bus interface coupled to the arbiter to convert the first and second memory access requests into a format compatible with the memory.

18. The system of claim 14 wherein the memory controller further comprises a memory bus interface coupled to the arbiter to determine whether to generate page commands to the memory.

19. The system of claim 14 wherein the arbiter is configured to decide which memory access request to initiate first according to predetermined criteria, if the first and the second memory access requests are received simultaneously.

20. The system of claim 14 wherein the arbiter is configured to assign a priority to the first and second processors to decide an order in which to initiate memory accesses when the first and the second memory access requests are received simultaneously.

21. The system of claim 14 wherein the first and second bus interfaces include respective first and second multiple processor buses.

22. The system of claim 14 wherein the memory includes dynamic random access memory.

23. The system of claim 14 wherein the first and second bus interfaces are configured to convert respective first and second memory access requests into a common format.

24. The system of claim 14 wherein the arbiter is configured to convert addresses specified in the first and second memory access requests into respective first and second row and column addresses.

25. An article comprising a computer-readable medium that stores computer-executable instructions for causing a computer system to:
    initiate a first memory access in response to receipt of a first memory access request; and
    initiate a second memory access in response to receipt of a second memory request prior to completing the first memory access,
    wherein the second memory access is initiated without deferring the first memory access or without deferring the second memory access.

26. The article of claim 25 wherein the computer-readable medium stores computer-executable instructions further causing a computer system to convert the first and second memory access requests into a format compatible with a memory.

27. The article of claim 25 wherein the computer-readable medium stores computer-executable instructions further causing a computer system to generate page commands to a memory.

28. The article of claim 25 wherein the computer-readable medium stores computer-executable instructions further causing a computer system to decide which memory access request to initiate first according to predetermined criteria, if the first and the second memory access requests are received simultaneously.

29. The article of claim 25 wherein the computer-readable medium stores computer-executable instructions further causing a computer system to convert addresses specified in the first and second memory access requests into a respective row and column addresses.

30. The article of claim 25 wherein the computer-readable medium stores computer-executable instruction further causing a computer system to retrieve first and second data from first and second locations, respectively, by the first and second memory access requests.

* * * * *